United States Patent [19]

Herzl

[11] Patent Number: 4,651,027

[45] Date of Patent: Mar. 17, 1987

[54] CURRENT-TO-FREQUENCY CONVERTER

[75] Inventor: Peter J. Herzl, Morrisville, Pa.

[73] Assignee: Fischer & Porter Company, Warminster, Pa.

[21] Appl. No.: 749,386

[22] Filed: Jun. 27, 1985

[51] Int. Cl.⁴ .................. H03K 13/02; H03L 7/00
[52] U.S. Cl. ............................ 307/271; 307/479; 307/270; 328/127; 328/115; 328/118; 340/347 NT
[58] Field of Search ............ 307/270, 271, 273, 219.1, 307/479, 262; 328/127, 140, 150, 138, 118, 115; 340/347 NT; 363/10

[56] References Cited

U.S. PATENT DOCUMENTS 4,109,168  8/1978  Raymond ........................ 307/271
4,507,624  3/1985  Ley et al. ....................... 332/11 D

FOREIGN PATENT DOCUMENTS 651478  3/1979  U.S.S.R. .

Primary Examiner—Stanley D. Miller
Assistant Examiner—Richard Roseen
Attorney, Agent, or Firm—Michael Ebert

[57] ABSTRACT

An analog current-to-frequency converter which produces output pulses whose repetition rate depends on the current value. Included in the converter is an operational amplifier having an inverting input to which is applied a negative input voltage whose magnitude is proportional to the current value. The amplifier functions as an integrator which yields a positive output only when the voltage at its inverting input is negative. The integrator output is so coupled to the input of a one-shot as to cause the one-shot to generate an output pulse each time the integrator output crosses over from negative to positive. A NOR gate coupled to the one-shot acts to activate a switch only when the integrator output goes positive, the activated switch applying a positive reference voltage to the inverting input of the integrator through a balance resistor, thereby initiating a swing from negative to positive until a point is reached at which the integrator output goes from positive to negative. At this point the switch is deactivated to remove the positive reference voltage, the integrator output again going positive as a result of which the one-shot generates another pulse. Thus the integrator output in response to the applied negative input voltage oscillates from positive to negative to cause the one-shot controlled thereby to generate output pulses whose repetition rate is proportional to the value of the current being converted.

6 Claims, 1 Drawing Figure

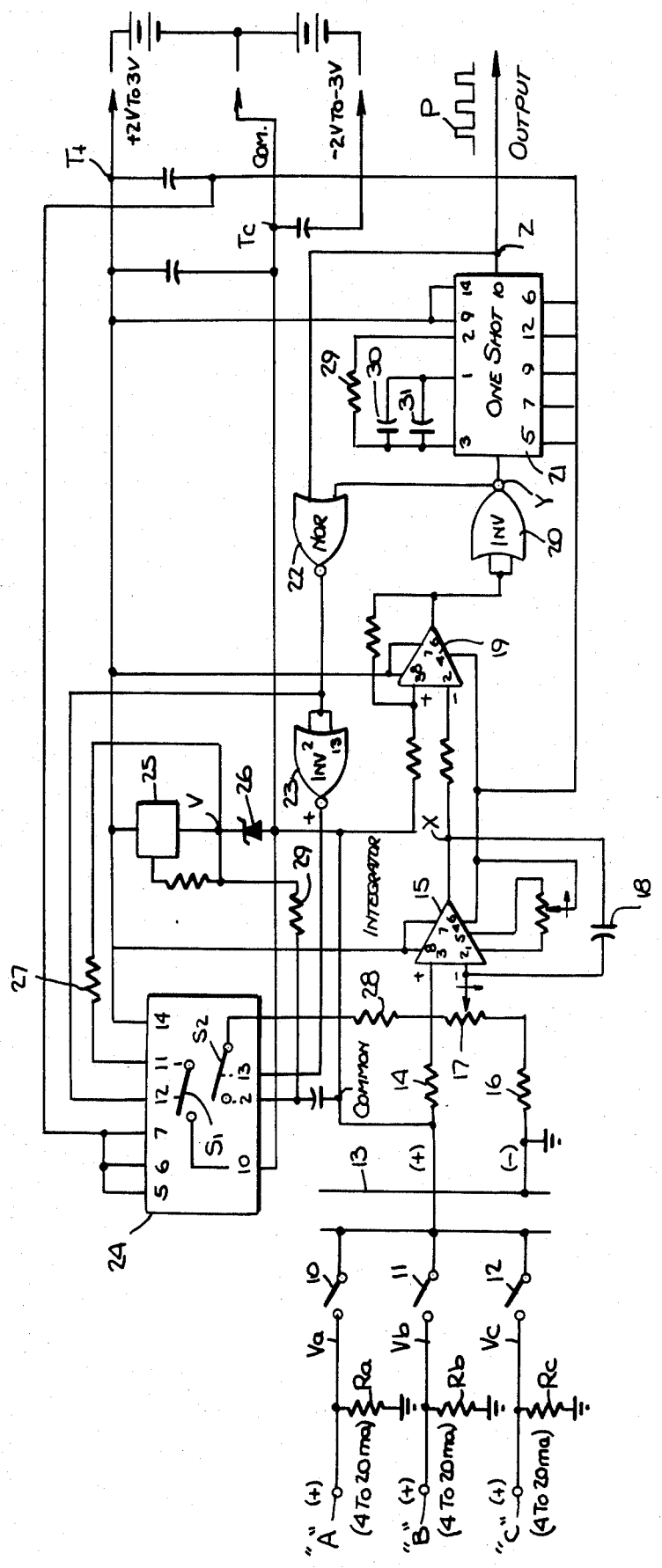

CURRENT-TO-FREQUENCY CONVERTER

BACKGROUND OF INVENTION

1. Field of Invention

This invention relates generally to current-to-frequency converters which produce pulses whose repetition rate depends on the current level, and more particularly to a converter of this type whose required operating power is extremely low so that the converter can be battery operated.

2. Status of Prior Art

In a typical industrial process control loop that is subject to disturbances, a controller acts in conjunction with other devices to maintain the process variable at a desired value. The variable factor controlled may be flow rate, pressure, viscosity, liquid level, or any other process variable. Each process variable is sensed by a transducer such as a pressure gauge, a magnetic flowmeter, or a temperature-sensitive element which converts the sensed process variable into a corresponding electrical analog signal. In many transducers of this type, the output yielded thereby lies in the 4 to 20 milliampere range, this being the standard range in the process control field.

In operation, the electronic controller receives both the process variable and a set point signal, and compares these electrical values to produce an output signal that reflects the deviation of the process variable from the set point. This output signal is applied to the final control element in the loop to directly or indirectly govern the process variable. Thus the process variable input signal to a controller may be derived from a flowmeter whose reading is converted into a corresponding electrical value, and the output signal from the controller may be impressed on a flow-regulating valve which is adjusted to cause the flow rate to conform to the set point.

In recent years, process control systems have been developed which include a multiplicity of process control loops and a digital computer common thereto functioning as a controller for all of the loops. To obviate the need for complex wiring arrangements, the exchange of information between the loop sensors and the final control elements in the respective loops is effected by a timesharing multiplexing technique.

Various forms of multiplexer networks associated with a multiplicity of process control loops and operating in conjunction with a digital computer which regulates each loop, are disclosed in the Nabi U.S. Pat. No. 3,760,374 (Foxboro), the Smith U.S. Pat. No. 3,566,355 (Motorola), the Ries et al. U.S. Pat. No. 3,526,757 (Owens-Corning), and the Jacques et al. U.S. Pat. No. 3,479,493 (IBM). In the multiplexer coupled analog input technique, each control loop transducer is connected by switch to a multiplexer bus. The switches for the several transducers are sequentially actuated so that successively applied to the bus are the analog signals from the loop transducers. The bus is connected through an amplifier to an analog-to-digital converter whose digital signals are applied to the digital computer which governs the final control elements in the loops.

Thus in an era of microprocessors and microcomputers, a common requirement where the input data is in analog current or voltage form, is an A to D converter for converting the analog value into a digital format which can be processed by digital equipment.

The problem to which the present invention is directed is that which arises where the transducer which serves the process variables is at a remote field location lacking power line facilities, and where it is then necessary to operate the A to D converter with battery power. One must under these circumstances provide a converter which draws very little current from the low voltage battery supply; otherwise the battery will be exhausted in a relatively short period.

It is also essential that the converter so operated have an accuracy comparable to that of conventional A to D converters which draw their operating power from a power line.

SUMMARY OF INVENTION

In view of the foregoing, the main object of this invention is to provide a current-to-frequency converter adapted to convert current values to digital form at very low power levels, such as 0.0002 watts.

More particularly, it is an object of this invention to provide a battery operated converter of the above type which is highly accurate and fast-acting, so that it can be used in conjunction with a multiplexer in which sample voltages are sequentially applied thereto at a rapid rate, each of which must be converted into digital form.

A significant advantage of a converter in accordance with the invention is that it is capable of operating on less than 50 microamperes and ±2 volts, yet it has an accuracy comparable to conventional 12 bit A to D or D to A converters.

Briefly stated, these objects are attained in an analog current-to-frequency converter which produces output pulses whose repetition rate depends on the current value. Included in the converter is an operational amplifier having an inverting input to which is applied a negative input voltage whose magnitude is proportional to the current value. The amplifier functions as an integrator which yields a positive output only when the voltage and its inverting input is negative. The integrator output is so coupled to the input of a one-shot as to cause the one-shot to generate an output pulse each time the integrator output crosses over from negative to positive. A NOR gate coupled to the one-shot acts to activate a switch only when the integrator output goes positive, the activated switch applying a positive reference voltage to the inverting input of the integrator through a balance resistor, thereby initiating a swing from negative to positive until a point is reached at which the integrator output goes from positive to negative.

At this point the switch is deactivated to remove the positive reference voltage, the integrator output again going positive as a result of which the one-shot generates another pulse. Thus the integrator output in response to the applied negative input voltage oscillates from positive to negative to cause the one-shot controlled thereby to generate output pulses whose repetition rate or frequency is proportional to the value of the current being converted.

OUTLINE OF DRAWING

For a better understanding of the invention as well as other objects and features thereof, reference is made to the attached figure which is a schematic circuit diagram of a preferred embodiment of the current-to-frequency converter.

DESCRIPTION OF INVENTION

The Converter Circuit

Referring now to the single FIGURE, there is shown the circuit of an analog current-to-frequency converter in accordance with the invention whose input is coupled to a multiplexer provided with sequentially-actuated switches 10, 11 and 12. These switches act to apply analog voltage samples derived from three separate current sources A, B and C to a multiplexer bus 13 connected to the converter input. Associated with current sources A, B and C are resistors $R_a$, $R_b$, and $R_c$, respectively, the voltage drop across each resistor depending on the intensity of the current applied thereto.

Analog current source A represents, for example, the output of a pressure sensor or flowmeter in a 4 to 20 mA range, this being standard in the industrial process control field. This current produces a corresponding analog voltage $V_a$ across resistor $R_a$, a sample of which is applied across bus 13 when switch 10 is closed.

Analog current source B represents another process variable so that a sample of the resultant voltage $V_b$ across resistor $R_b$ is applied to bus 13 when switch 11 is closed. And the analog current from source C produces an analog voltage $V_c$ across resistor $R_c$, a sample of which is applied to bus 13 when switch 13 is closed.

The positive side of bus 13 is connected through a resistor 14 (one meg) to the non-inverting (+) input of an operational amplifier 15. The grounded negative-voltage side of bus 13 is connected through an input resistor 16 (one meg) to one end of a span-control potentiometer 17 (100 K) whose adjustable arm is connected to the inverting input (−) of operational amplifier 15. The output of amplifier 15 is connected through an integrating capacitor 18 (0.33/80) to the inverting (−) input thereof so as to render the amplifier operative as an integrator.

In practice, integrator amplifier 15 may be a TLC271ACP chip produced by Texas Instruments. The output of amplifier 15, which appears at point X, is connected to the inverting (−) input of a second operational amplifier 19 which may be identical to amplifier 15, except that it is arranged to operate as a Schmitt trigger that is triggered to produce a square wave output at a pre-determined point in each positive swing of the input signal.

The output of Schmitt trigger 19 is applied to the input of an inverter 20 whose output at point Y goes to the trigger input of a one shot 21. In practice, one shot 21 may be an RCA CD 4047B chip. The timing of one shot 21 is determined by resistor 29 and shunted capacitors 30 and 31. One shot 21 yields pulses P at point Z representing the digital output of the system, the pulse frequency depending on the magnitude of the sample voltage applied to the input of the converter. The converter operates in a low frequency range, so that with analog current sources in a 4 to 20 mA range, the output pulses of the converter will lie, say, in a low frequency 1 to 100 Hz range.

The output of inverter 20 at point Y is also applied to one input of a NOR gate 22 whose other input is connected to point Z which is the output of one shot 21. Thus the action of the NOR gate depends on the polarity of the voltages at points Y and Z, the output being positive only if both inputs are negative. The output of NOR gate 22 goes to the input of an inverter 23 as well as to pin 12 of an electronic switch 24 which, in practice, may be a CD 4066 chip marketed by RCA. Electronic switch 24 incorporates two single-pole, single-throw solid state switches $S_1$ and $S_2$. Switch $S_1$ is caused to close to complete a circuit between pins 10 and 11 when a positive voltage is applied to control pin 12. Switch $S_2$ is caused to close to complete a circuit between pins 1 and 2 when a positive voltage is applied to control pin 13.

Power for the converter is supplied by two d-c sources, one of which (+2 to +3 volts) is connected between terminal T+ and common terminal $T_c$, the other source (−2 to −3 volts) being connected between the common terminal $T_c$ and terminal T−. The positive terminal T+ is connected to the power input pins on one shot 21, electronic switch 24, integrator 15 and Schmitt trigger 19. Positive terminal T+ is also connected to a constant current source 25 which feeds a zener diode 26 acting as a voltage reference. This reference voltage is available at point V.

Pin 10 of switch $S_1$ is connected to common terminal $T_c$, and pin 11 of this switch is connected through a resistor 27 (549 K) to voltage reference point V, so that when switch $S_1$ is closed, the voltage reference V is then connected to common. A balance resistor 28 (499 K) is connected between pin 1 of switch $S_2$ and the other end of potentiometer 28, while pin 2 of this switch is connected through resistor 29 to voltage reference point V. Thus when switch $S_2$ is closed, the voltage reference V is applied through balance resistor 28 to potentiometer 17 whose movable arm is connected to the inverting input (−) of integrator 15.

Theory of Operation

The converter illustrated functions as an analog voltage-to-digital pulse converter in which the frequency of pulses P yielded thereby is directly proportional to the magnitude of the applied voltage sample. Thus a 2.5 volt input is converted to, say, 50 Hz pulses, and a 5.0 volt input is converted into 100 Hz pulses. Since the voltage input samples are derived from current sources, these currents must be changed into corresponding voltages, this being the function of resistors $R_a$, $R_b$, and $R_c$.

When a sample voltage from the multiplexer bus 13 is suddenly applied to the input of the converter, the voltage developed across input resistor 16 connected to the inverting (−) input of integrator 15 becomes negative (−) relative to common. As a consequence, the output of integrator 15 at point X goes positive (+). Since this (+) output is applied to the inverting (−) input of Schmitt trigger 19, its output goes negative (−), and the output of inverter 20, whose input is coupled to Schmitt trigger 19, goes positive (+) at output point Y.

One shot 21 yields a single pulse P each time a positive voltage is applied to its trigger input T connected to point Y. One input of NOR gate 22 is connected to point Y and the other to point Z which is the output of one shot 21. The output of NOR gate 21 becomes positive only when the two inputs thereto are negative. Hence the output of NOR gate 22 stays negative as long as either point Y or point Z is positive.

Thus when the output of integrator 15 at point X first goes positive, the output of NOR gate 22 then goes negative (−), and the output of NOR gate 22 becomes positive (+). Since this positive output from inverter 23 is applied to control pin 13 for switch $S_2$, it acts to close this switch and thereby apply the (+) reference voltage V to balance resistor 28, from which it goes to the inverting (−) input of integrator 15.

When the sample voltage was first applied to the input of the converter, the inverting input of integrator 15 went negative and output point X went positive. But with the closure of switch $S_2$, the inverting input starts to swing in the positive direction. As long as the output of integrator at point X is undergoing a change in state from (+) to (−), switch $S_2$ remains closed; but when the output of integrator 15 at point X goes negative, then points Y and Z are rendered negative and the NOR gate 22, whose two inputs are connected to these points yields a positive voltage output.

Thus when the output of NOR gate 22 goes positive, inverter 23 coupled thereto yields a negative output which is applied to control pin 13 of switch $S_2$ of electronic switch 24, thereby causing switch $S_2$ to open and to disconnect voltage reference V from balance resistor 28.

The connection between the output of inverter 20 at point Y and one input of NOR gate 22 is one of the unique features of the invention, for it gives rise to the fastest possible way to establish balance. In prior converters, pulses at a high repetition rate were used to attain balance. But this takes a much longer time and represents a distinct disadvantage when multiplexing several inputs at a rapid rate.

When the output of integrator 15 at point X changes state from (+) to (−), switch $S_2$ of electronic switch 24 opens, if no pulse from one shot 21 is then present at its output point Z, for now the two inputs to NOR gate 22 from points Y and Z are negative and the NOR gate then yields a positive voltage output. When switch $S_2$ is caused to open, switch $S_1$ is at the same time caused to close, for its control pin 12 is connected to the output of NOR gate 22 which is then positive. Since the positive output of the NOR gate causes switch $S_1$ to close, the same positive output which is inverted by inverter 23 to provide a negative voltage causes switch $S_2$ to open.

When switch $S_1$ is caused to close, this acts to connect voltage reference V through resistor 27 to common. This is another unique feature of the invention, for balance resistor 28 plus half of potentiometer 17 and resistor 27 draw approximately the same current from constant current source 25. Since one or the other is always in the circuit, the current going through voltage reference 26 is unchanging, and the reference voltage is very stable. If a step change in current through the voltage reference were allowed, the reference voltage at point V would change slightly and oscillate or ring for a short time. Since the accuracy of the converter depends on the amplitude and width of the pulses being integrated, this ringing would give rise to errors.

When switch $S_1$ of the electronic switch 24 is caused to open, the output of integrator 15 then starts to swing in the positive direction. As soon as the voltage at the output of the integrator at point X crosses over to the positive, one shot 21 then generates an output pulse P, this action resulting in the momentary closure of switch $S_2$ and a reversal in the direction of the output of the integrator 15.

Thus, in operation, the output of integrator 15 at point X oscillates with respect to common at a rate determined by the magnitude of the sample voltage input thereto, every positive transaction producing a single pulse P. Under steady state conditions, the repetition rate, hence the frequency of pulses P, is such that the integration of the current produced by the pulses in balance resistor 28 equals the current flowing through the converter input resistor 16 which in turn depends on the magnitude of the sample voltage.

The current or voltage-to-frequency converter in accordance with the invention has still another unique feature. As noted previously, the accuracy of the converter depends mainly on the height and width of pulses P generated by the converter; the height reflecting the voltage amplitude of the pulses, and the width of the time duration thereof.

Under fixed reference conditions, the converter is extremely accurate. However, with changes in temperature, some of the converter components undergo slight changes in characteristics. For example, electronic switch 24 is subject to changes in resistance with temperature, whereas the other components are available commercially with very low temperature coefficients. The components which have the greatest effect on accuracy are balance resistor 28, feedback resistor 29 in the one shot 21, and integrator capacitor 18; and these are selected for good temperature stability The timing of one shot 21 is determined by resistor 20 and capacitors 30 and 31. Capacitor 31 is a temperature stable capacitor, while capacitor 30 connected thereacross is selected to have a rather high temperature coefficient. By changing the ratio of these capacitors, the temperature coefficient of the converter can be adjusted in very fine steps and a very stable current-to-frequency converter can be realized thereby.

While there has been shown and described a preferred embodiment of CURRENT-TO-FREQUENCY CONVERTER in accordance with the invention, it will be appreciated that many changes and modifications may be made therein without, however, departing from the essential spirit thereof.

I claim:

1. A current-to-frequency converter which produces output pulses whose repetition rate depends on the input current value, said converter comprising:
  A. an operational amplifier functioning as an integrator having an inverting input;
  B. means to apply to said inverting input a negative input voltage whose magnitude is proportional to the current value being converted, the integrator output being positive only when the voltage applied at its inverting input is negative;
  C. a one-shot having a trigger input and an output, the one-shot generating a single output pulse each time a positive voltage is applied to its trigger input, the integrator output being so coupled so the trigger input as to cause the one-shot to generate an output pulse each time the integrator output crosses over from negative to positive;
  D. a positive reference voltage source;
  E. a first electronic switch which when activated connects the positive reference voltage to the inverting input of the integrator through a balance resistor;
  F. means including a NOR gate coupled to the input and output of the one-shot to activate said switch only when the integrator output goes positive, the switch then applying the positive reference voltage to the balance resistor to initiate a swing from negative to positive until a point is reached at which the integrator output goes from positive to negative, at which point the switch is deactivated to disconnect the positive reference voltage, as a result of which the integrator output again goes positive and the one-shot generates another pulse whereby the integrator output in response to the applied negative input voltage oscillates from positive to negative to cause the one-shot controlled thereby to generate said output pulses at a repeating rate that depends on the value of the current being converted, said integrator output being coupled to the trigger input of the one-shot by way of a Schmitt trigger which converts the positive output of the integrator into a negative pulse which is applied to the trigger input through a first inverter.

2. A converter as set forth in claim 1, wherein the inputs of said NOR gate are connected respectively to the trigger input and to the output of the one-shot to produce a positive gate output only when both of its inputs are negative, the NOR gate output being applied to the first electronic switch through a second inverter which provides a positive output to activate this switch only when the NOR gate output is negative.

3. A converter as set forth in claim 2 further including a second electronic switch which is coupled to the output of the NOR gate and is activated only when the gate output is positive, said second switch connecting said positive reference voltage to common.

4. A converter as set forth in claim 1, wherein said positive reference voltage is derived from a constant current source connected to a zener diode, the reference voltage being established at the junction of the diode and the constant current source.

5. A converter as set forth in claim 1, wherein said operational amplifier is associated with an integrator capacitor connected between the output thereof and the inverting input.

6. A converter as set forth in claim 1, wherein said Schmitt trigger is formed by a second operational amplifier having an inverting input to which the output of the integrator is applied.

* * * * *